(12) United States Patent
Chang et al.

(10) Patent No.: US 7,679,431 B2
(45) Date of Patent: Mar. 16, 2010

(54) LOW FLICKER NOISE MIXER AND BUFFER

(75) Inventors: Yuyu Chang, Irvine, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 10 days.

(21) Appl. No.: 11/944,715

(22) Filed: Nov. 26, 2007

(65) Prior Publication Data

US 2009/0134932 A1 May 28, 2009

(51) Int. Cl.
*H03B 1/00* (2006.01)
*H03K 5/00* (2006.01)
*H04B 1/10* (2006.01)

(52) U.S. Cl. .................. 327/552; 327/551; 327/557; 327/558; 327/559

(58) Field of Classification Search .................. 327/551, 327/552, 557–559
See application file for complete search history.

(56) References Cited

U.S. PATENT DOCUMENTS 5,331,290 A * 7/1994 Harford et al. .............. 330/254

2008/0280585 A1* 11/2008 Chen et al. .................. 455/338

* cited by examiner

*Primary Examiner*—Lincoln Donovan
*Assistant Examiner*—Daniel Rojas
(74) *Attorney, Agent, or Firm*—Garlick Harrison & Marksion; Shayne X. Short

(57) ABSTRACT

Low flicker noise mixer and buffer. This design employs some native metal oxide semiconductor field-effect transistors (MOSFETs) (e.g., having no threshold voltage) within a passive mixer whose gates are driven using clock signals. These native MOSFETs maybe biased at one half of the power supply voltage to provide a lower noise figure. A cooperatively operating buffer employs appropriately places MOSFETs and resistors to ensure the desired gain. Relatively larger valued resistors can be employed to provide for higher voltage gain, and this can sometimes be accompanied with using a higher than typical power supply voltage. Source followers serve as output buffers and also ensure the required output DC voltage level as well. It is also noted that this design can be implemented using n-channel metal oxide semiconductor field-effect transistors (N-MOSFETs) of p-channel metal oxide semiconductor field-effect transistors (P-MOSFETs).

20 Claims, 4 Drawing Sheets

LOW FLICKER NOISE MIXER AND BUFFER

BACKGROUND OF THE INVENTION

1. Technical Field of the Invention

The invention relates generally to communication systems; and, more particularly, it relates to mixer-buffers employed within communication devices employed within such communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

As the desire for wireless communication devices to support multiple standards continues, recent trends include the desire to integrate more functions on to a single chip. However, such desires have gone unrealized when it comes to implementing baseband and RF on the same chip for multiple wireless communication standards. In addition, many components and/or modules within the components employed within such communication devices and wireless communication devices include many off-chip elements.

Generally speaking, prior art approaches and implementations of passive mixers have a gain attenuation. This typically prohibits their implementation in wireless communication devices. In the wireless communication system context, where power consumption is oftentimes of paramount importance, the use of passive elements can be desirable (e.g., lower power consumption as well as no flicker noise contribution). Active mixer mixers can be implemented that provide for generally much higher voltage gain than passive mixers, but the switching pairs therein oftentimes contribute to very large and undesirable flicker noise. Presently, the prior art fails to provide for a good design of a mixer to ensure the sufficient gain properties required for many wireless communication system applications while also ensuring relatively low power consumption.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel circuitry for providing a combined mixer and buffer circuitry is presented. This design provides a relatively lower flicker noise than prior art approaches. This design also employs some native metal oxide semiconductor field-effect transistors (MOSFETs) (e.g., having no threshold voltage) within a passive mixer whose gates are driven using clock signals. This lower flicker noise is ensured, at least in part, because of the use of a passive mixer and relatively high valued resistors. These native MOSFETs maybe biased at one half of the power supply voltage to provide a lower noise figure. A much higher voltage gain is achieved by this novel design when compared to conventional/prior art mixer designs that have relatively significant gain attenuation. In addition, from a transconductance module, coupling is made to the passive mixer via relatively small sized capacitors thereby significantly reducing silicon area within the circuitry.

A cooperatively operating buffer employs appropriately places MOSFETs and resistors to ensure the desired gain. Relatively larger valued resistors can be employed to provide for higher voltage gain, and this can sometimes be accompanied with using a higher than typical power supply voltage. Source followers serve as output buffers and also ensure the required output DC voltage level as well. It is also noted that this design can be implemented using n-channel metal oxide semiconductor field-effect transistors (N-MOSFETs) of p-channel metal oxide semiconductor field-effect transistors (P-MOSFETs).

Figure 1:
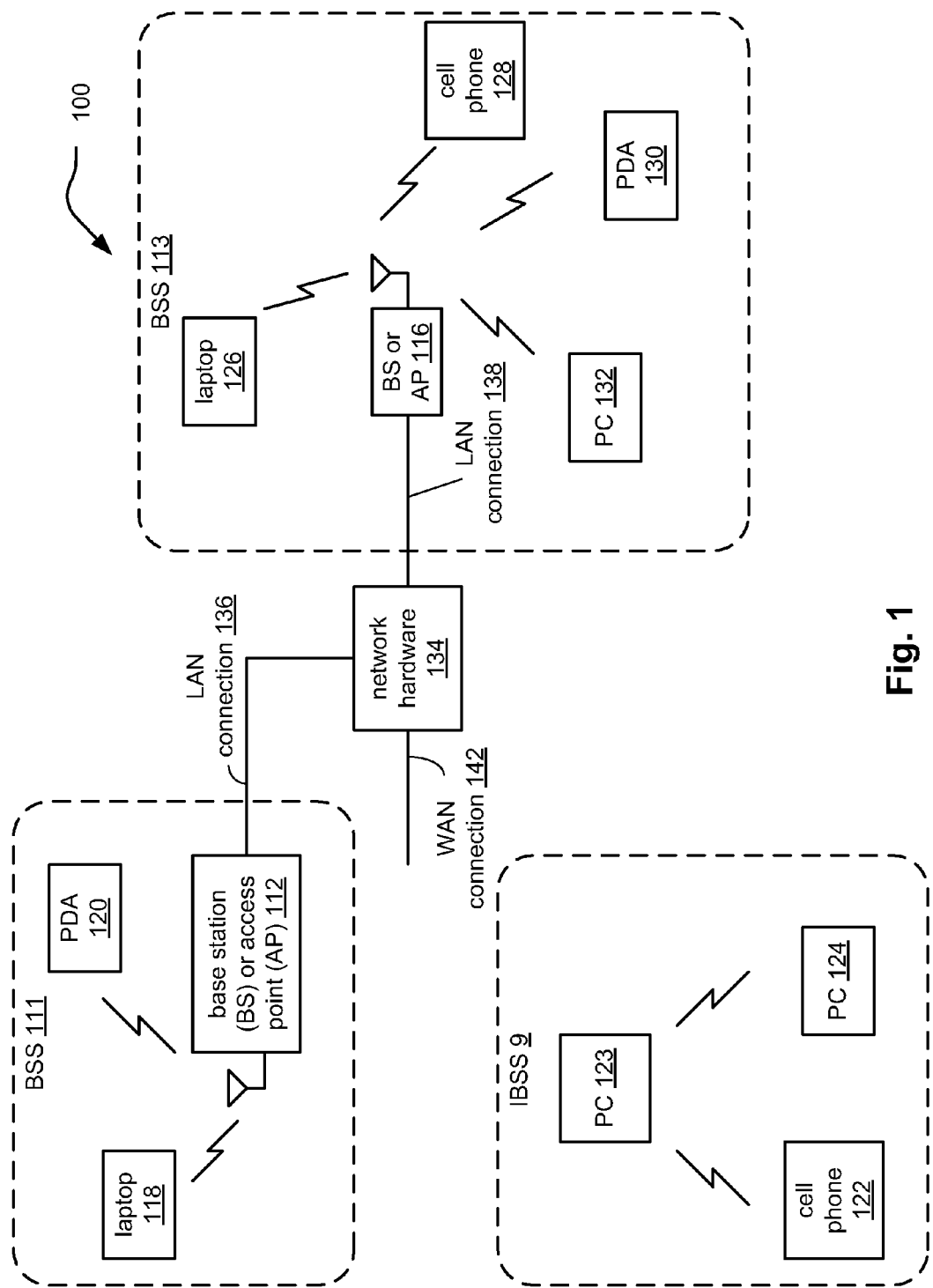
FIG. 1 is a diagram illustrating an embodiment of a wireless communication system.

FIG. 1 is a diagram illustrating an embodiment of a wireless communication system 100. The wireless communication system 100 includes a plurality of base stations and/or access points 112, 116, a plurality of wireless communication devices 118-132 and a network hardware component 134. Note that the network hardware 134, which may be a router, switch, bridge, modem, system controller, et cetera provides a wide area network connection 142 for the communication system 100. Further note that the wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within an independent basic service set (IBSS) area and communicate directly (i.e., point to point). In this configuration, these devices 122, 123, and 124 may only communicate with each other. To communicate with other wireless communication devices within the system 100 or to communicate outside of the system 100, the devices 122, 123, and/or 124 need to affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access point 112-116 with connectivity to other devices within the system 100 and provides connectivity to other networks via the WAN connection 142. To communicate with the wireless communication devices within its BSS 111 or 113, each of the base stations or access points 112-116 has an associated antenna or antenna array. For instance, base station or access point 112 wirelessly communicates with wireless communication devices 118 and 120 while base station or access point 116 wirelessly communicates with wireless communication devices 126-132. Typically, the wireless communication devices register with a particular base station or access point 112, 116 to receive services from the communication system 100.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
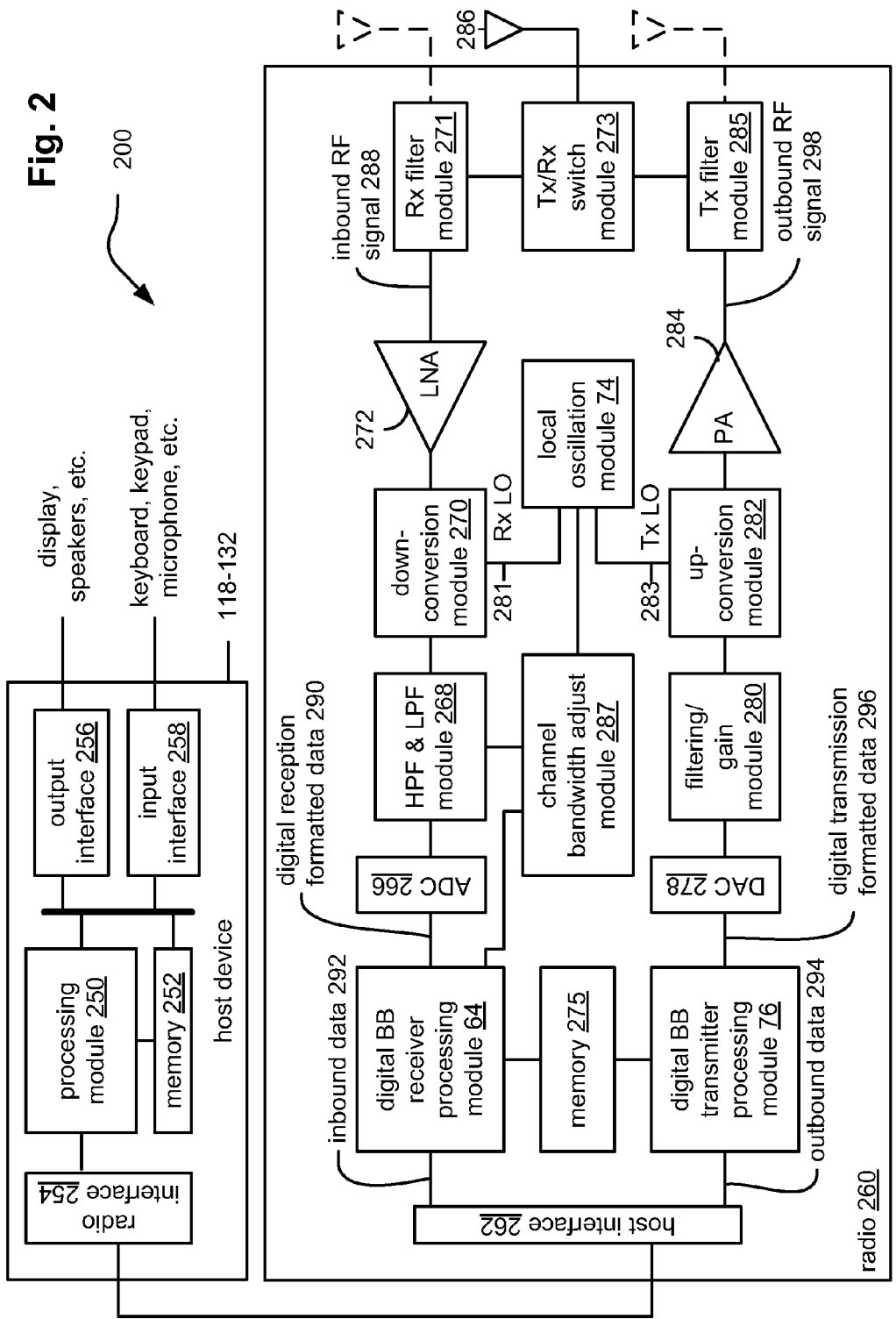
FIG. 2 is a diagram illustrating an embodiment of a wireless communication device.

FIG. 2 is a diagram illustrating an embodiment of a wireless communication device 200 that includes the host device 118-132 and an associated radio 260. For cellular telephone hosts, the radio 260 is a built-in component. For personal digital assistants hosts, laptop hosts, and/or personal computer hosts, the radio 260 may be built-in or an externally coupled component.

As illustrated, the host device 118-132 includes a processing module 250, memory 252, a radio interface 254, an input interface 258, and an output interface 256. The processing module 250 and memory 252 execute the corresponding instructions that are typically done by the host device. For example, for a cellular telephone host device, the processing module 250 performs the corresponding communication functions in accordance with a particular cellular telephone standard.

The radio interface 254 allows data to be received from and sent to the radio 260. For data received from the radio 260 (e.g., inbound data), the radio interface 254 provides the data to the processing module 250 for further processing and/or routing to the output interface 256. The output interface 256 provides connectivity to an output display device such as a display, monitor, speakers, et cetera such that the received data may be displayed. The radio interface 254 also provides data from the processing module 250 to the radio 260. The processing module 250 may receive the outbound data from an input device such as a keyboard, keypad, microphone, et cetera via the input interface 258 or generate the data itself. For data received via the input interface 258, the processing module 250 may perform a corresponding host function on the data and/or route it to the radio 260 via the radio interface 254.

Radio 260 includes a host interface 262, digital receiver processing module 264, an analog-to-digital converter 266, a high pass and low pass filter module 268, an IF mixing down conversion stage 270, a receiver filter 271, a low noise amplifier 272, a transmitter/receiver switch 273, a local oscillation module 274, memory 275, a digital transmitter processing module 276, a digital-to-analog converter 278, a filtering/gain module 280, an IF mixing up conversion stage 282, a power amplifier 284, a transmitter filter module 285, a channel bandwidth adjust module 287, and an antenna 286. The antenna 286 may be a single antenna that is shared by the transmit and receive paths as regulated by the Tx/Rx switch 273, or may include separate antennas for the transmit path and receive path. The antenna implementation will depend on the particular standard to which the wireless communication device 200 is compliant.

The digital receiver processing module 264 and the digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 264 and 276 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 275 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 264 and/or 276 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 260 receives outbound data 294 from the host device via the host interface 262. The host interface 262 routes the outbound data 294 to the digital transmitter processing module 276, which processes the outbound data 294 in accordance with a particular wireless communication standard (e.g., IEEE 802.11, Bluetooth, ZigBee, any other type of radio frequency based network protocol and/or variations thereof et cetera) to produce outbound baseband signals 296. The outbound baseband signals 296 will be digital base-band signals (e.g., have a zero IF) or digital low IF signals, where the low IF typically will be in the frequency range of one hundred kHz (kilo-Hertz) to a few MHz (Mega-Hertz).

The digital-to-analog converter 278 converts the outbound baseband signals 296 from the digital domain to the analog domain. The filtering/gain module 280 filters and/or adjusts the gain of the analog signals prior to providing it to the IF mixing stage 282. The IF mixing stage 282 converts the analog baseband or low IF signals into RF signals based on a transmitter local oscillation 283 provided by local oscillation module 274. The power amplifier 284 amplifies the RF signals to produce outbound RF signals 298, which are filtered by the transmitter filter module 285. The antenna 286 transmits the outbound RF signals 298 to a targeted device such as a base station, an access point and/or another wireless communication device 200.

The radio 260 also receives inbound RF signals 288 via the antenna 286, which were transmitted by a base station, an access point, or another wireless communication device. The antenna 286 provides the inbound RF signals 288 to the receiver filter module 271 via the Tx/Rx switch 273, where the Rx filter 271 bandpass filters the inbound RF signals 288. The Rx filter 271 provides the filtered RF signals to low noise amplifier 272, which amplifies the signals 288 to produce an amplified inbound RF signals. The low noise amplifier 272 provides the amplified inbound RF signals to the IF mixing module 270, which directly converts the amplified inbound RF signals into an inbound low IF signals or baseband signals based on a receiver local oscillation 281 provided by local oscillation module 274. The down conversion module 270 provides the inbound low IF signals or baseband signals to the filtering/gain module 268. The high pass and low pass filter module 268 filters, based on settings provided by the channel bandwidth adjust module 287, the inbound low IF signals or the inbound baseband signals to produce filtered inbound signals.

The analog-to-digital converter 266 converts the filtered inbound signals from the analog domain to the digital domain to produce inbound baseband signals 290, where the inbound baseband signals 290 will be digital base-band signals or digital low IF signals, where the low IF typically will be in the frequency range of one hundred kHz to a few MHz. The digital receiver processing module 264, based on settings provided by the channel bandwidth adjust module 287, decodes, descrambles, demaps, and/or demodulates the inbound baseband signals 290 to recapture inbound data 292 in accordance with the particular wireless communication standard being implemented by radio 260. The host interface 262 provides the recaptured inbound data 292 to the host device 118-132 via the radio interface 254.

As one of average skill in the art will appreciate, the wireless communication device 200 of FIG. 2 may be implemented using one or more integrated circuits. For example, the host device may be implemented on one integrated circuit, the digital receiver processing module 264, the digital transmitter processing module 276 and memory 275 may be implemented on a second integrated circuit, and the remaining components of the radio 260, less the antenna 286, may be implemented on a third integrated circuit. As an alternate example, the radio 260 may be implemented on a single integrated circuit. As yet another example, the processing module 250 of the host device and the digital receiver and transmitter processing modules 264 and 276 may be a common processing device implemented on a single integrated circuit. Further, the memory 252 and memory 275 may be implemented on a single integrated circuit and/or on the same integrated circuit as the common processing modules of processing module 250 and the digital receiver and transmitter processing module 264 and 276.

Figure 3:
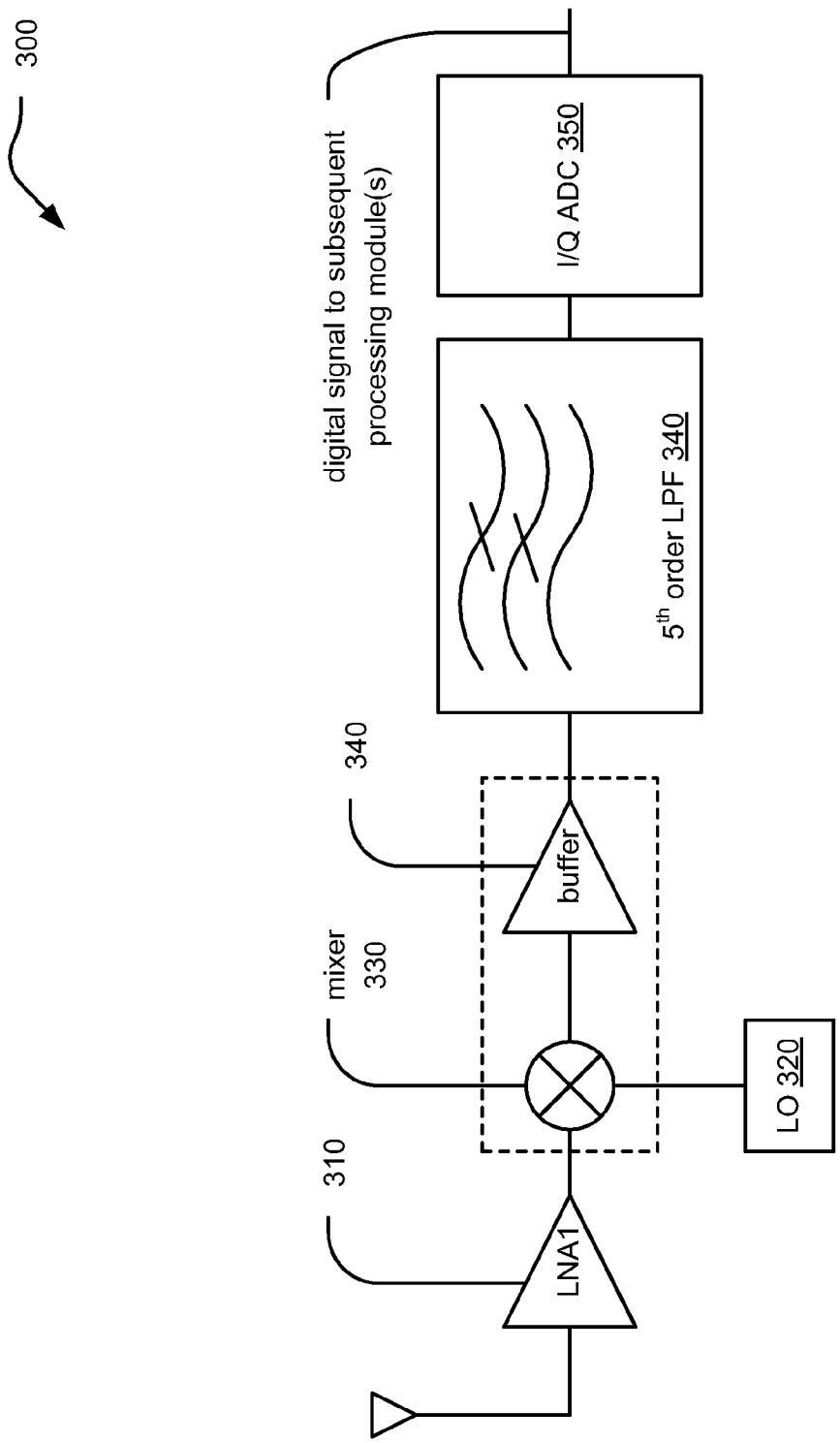
FIG. 3 is a diagram illustrating an embodiment of a wireless communication device that includes a combined mixer and buffer.

FIG. 3 is a diagram illustrating an embodiment of a wireless communication device 300 that includes a combined mixer and buffer. An antenna receives a wireless signal and provides it to a low noise amplifier (LNA) 310. The output from the LNA 310 is provided to a mixer 330. The mixer 330 performs any necessary frequency conversion based on a frequency provided by a local oscillator (LO) 320. The frequency converted signal output from the mixer 330 is provided to a buffer 340 and subsequently to a low pass filter (LPF) 340. The LPF 340 can be implemented as a $5^{th}$ order LPF in some embodiments. The output from the LPF 340 is provided to an analog to digital converter (ADC) 350. The ADC 350 performs conversion for both in-phase and quadrature signals. From the ADC 350, a digital signal is provided to one or more subsequent processing modules within or coupled to the wireless communication device 300.

Conventional passive mixers generally have a gain attenuation, thereby prohibiting their use in many wireless communication system applications. However, passive mixers have advantages of lower power consumption and negligible flicker noise contribution to the overall circuitry. Active mixers can provide for large voltage gain, but the switching pairs employed therein generally contribute a significantly large flicker noise. The buffer stage (e.g., the buffer 340) provides a stable DC output voltage, so any processing module following it has the proper DC operating point.

Figure 4:
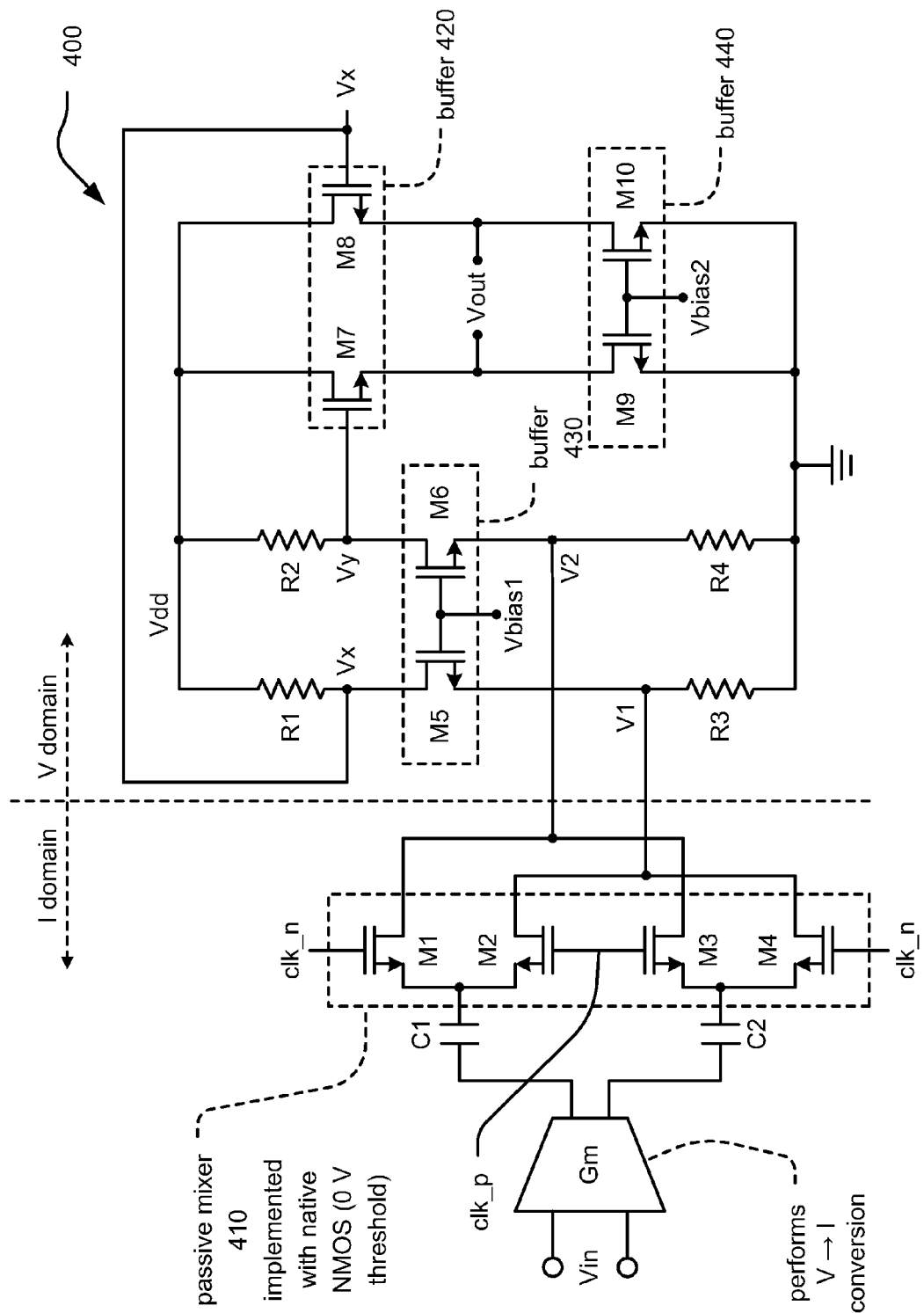
FIG. 4 is a diagram illustrating a combined mixer and buffer circuitry.

FIG. 4 is a diagram illustrating a combined mixer and buffer circuitry 400. A differential input voltage signal (Vin) is provided to a transconductance module (Gm) that is operable to convert the differential input voltage signal (Vin) to output currents (e.g., a differential current signal). Two capacitors (C1 and C2) are employed to block the DC current from coupling into a passive mixer 410. The passive mixer 410 include a plurality of native n-channel metal oxide semiconductor field-effect transistors (N-MOSFETs) depicted by M1, M2, M3, and M4. Generally, these native N-MOSFETs have a nearly zero threshold voltage. These native N-MOSFETs can be biased at one-half the voltage level typically provided by a power supply (e.g., ½ Vdd or 0.6 V when Vdd is 1.2 V). The use of native N-MOSFETs within the passive mixer 410 provides a better noise performance within the overall circuitry. By ensuring no DC current being injected into the passive mixer 410 (e.g., by using the two capacitors (C1 and C2)), there is no flicker noise generated by the native N-MOSFETs.

A source of a first native N-MOSFET (M1) is coupled to a source of a second native N-MOSFET (M2), and a source of a third native N-MOSFET (M3) is coupled to a source of a fourth native N-MOSFET (M4). A drain of the first native N-MOSFET (M1) is coupled to a drain of the third native N-MOSFET (M3), and a drain of the second native N-MOSFET (M2) is coupled to a drain of the fourth native N-MOSFET (M4). A first clock signal is provided to a gate of the first native N-MOSFET (M1) and a gate of the fourth native N-MOSFET (M4), and a second clock signal is provided to a gate of the second native N-MOSFET (M2) and a gate of the third native N-MOSFET (M3).

The first voltage signal provided from the drain of the second native N-MOSFET (M2) or the drain of the fourth native N-MOSFET (M4) is generated as V1. The second voltage signal from the drain of the first native N-MOSFET (M1) or the drain of the first native N-MOSFET (M3) is generated as V2. A resistor (R3) couples from the node having the voltage V1 to ground, and a resistor (R4) couples from the node having the voltage V2 to ground.

The sources of a pair of N-MOSFETs (M5 and M6), whose gates are coupled together and biased with a first bias voltage (Vbias1), couple to each of the resistor (R3) and the resistor (R4), respectively. A resistor (R1) couples from the drain of the N-MOSFET (M5) [node having a voltage of Vx] to a power supply voltage (Vdd). A resistor (R2) couples from the drain of the N-MOSFET (M6) [node having a voltage of Vy] to the power supply voltage (Vdd).

The node of the drain of the N-MOSFET (M5) couples to a gate of an N-MOSFET (M8), and the node of the drain of the N-MOSFET (M6) couples to a gate of an N-MOSFET (M7). The drains of the N-MOSFETs (M7 and M8) also couple to the power supply voltage (Vdd). The sources of the N-MOSFETs (M7 and M8) provide the output voltage of the combined mixer and buffer circuitry 400. The N-MOSFETs (M7 and M8) are also depicted as buffer 420.

Another pair of N-MOSFETs (M9 and M10) is implemented such that the drain of the N-MOSFET (M9) couples to the source of the N-MOSFET (M7), and the drain of the N-MOSFET (M10) couples to the source of the N-MOSFET (M8). The gates of the gates of the N-MOSFETs (M9 and MlO) are coupled together and biased with a second bias voltage (Vbias2). The sources of the N-MOSFETs (M9 and MlO) are connected to ground.

The resistors (R3 and R4) are employed instead of current sources thereby ensuring no introduction of flicker noise by these elements (i.e., resistors have no flicker noise). These two resistors are also used to establish a DC biasing point for mixers to operate properly. The common gate stage (N-MOSFETs M5 and M6) serve as buffers 430 to absorb the input currents provided to the nodes having voltages V1 and V2, respectively, and to transform them to output currents. The resistors (R1 and R2) are employed to convert these output currents to voltages thereby providing a large voltage gain and a relatively low noise figure. The N-MOSFETs M5 and M6 can be placed in a triple well to avoid potentially high break down voltage imposed within.

The source followers (N-MOSFETs M9 and M10) serve as an output buffer 440 and provides the required DC voltage to any subsequent stages that received the differential output voltage (Vout). The use of relatively large resistors (R1, R2, R3 and R4) provides a high voltage gain. This can sometimes be accompanied with using a higher than typical power supply voltage (e.g., Vdd has a voltage level that is higher than a typical valued power supply).

It is noted that the various modules (e.g., combined mixer and buffer circuitry, mixer, buffer, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A combined mixer and buffer circuitry, the circuitry comprising:
    a transconductance module that is operable to process a differential input voltage signal thereby generating a differential current signal;
    a passive mixer that is operable to process the differential current signal thereby generating a first output voltage signal and a second output voltage signal, wherein the passive mixer includes a plurality of native n-channel metal oxide semiconductor field-effect transistors (N-MOSFETs);
    first and second N-MOSFETs, wherein:
        the first output voltage signal is provided to a source of the first N-MOSFET; and
        the second output voltage signal is provided to a source of the second N-MOSFET;
    third and fourth N-MOSFETs, wherein:
        a gate of the fourth N-MOSFET is coupled to a drain of the first N-MOSFET;
        a gate of the third N-MOSFET is coupled to a drain of the second N-MOSFET;
        a drain of the third N-MOSFET is connected to a drain of the fourth N-MOSFET; and
        a source of the third N-MOSFET and a source of the fourth N-MOSFET correspond to a differential output voltage signal of the circuitry.

2. The circuitry of claim 1, wherein:
    the plurality of native N-MOSFET includes a first native N-MOSFET, a second native N-MOSFET, a third native N-MOSFET, and a fourth native N-MOSFET;
    a source of a first native N-MOSFET is coupled to a source of a second native N-MOSFET;
    a source of a third native N-MOSFET is coupled to a source of a fourth native N-MOSFET;
    a drain of the first native N-MOSFET is coupled to a drain of the third native N-MOSFET;
    a drain of the second native N-MOSFET is coupled to a drain of the fourth native N-MOSFET;
    a first clock signal is provided to a gate of the first native N-MOSFET and a gate of the fourth native N-MOSFET; and
    a second clock signal is provided to a gate of the second native N-MOSFET and a gate of the third native N-MOSFET.

3. The circuitry of claim 1, further comprising:
    a first capacitor; and
    a second capacitor; and wherein:
    the plurality of native N-MOSFET includes a first native N-MOSFET, a second native N-MOSFET, a third native N-MOSFET, and a fourth native N-MOSFET;
    a source of the first native N-MOSFET is coupled to a source of the second native N-MOSFET;
    a source of the third native N-MOSFET is coupled to a source of the fourth native N-MOSFET;
    the first capacitor is coupled between a first output of the transconductance module and the source of the first native N-MOSFET; and
    the second capacitor is coupled between a second output of the transconductance module and the source of the third native N-MOSFET.

4. The circuitry of claim 1, further comprising:
    a first resistor coupled between the source of the first N-MOSFET and ground; and
    a second resistor coupled between the source of the second N-MOSFET and ground.

5. The circuitry of claim 1, further comprising:
    a first resistor coupled between the drain of the first N-MOSFET and a power supply voltage; and
    a second resistor coupled between the drain of the second N-MOSFET and the power supply voltage.

6. The circuitry of claim 1, wherein:
    the connected drains of the third N-MOSFET and the fourth N-MOSFET are connected to a power supply voltage.

7. The circuitry of claim 1, further comprising:
    fifth and sixth N-MOSFETs, wherein:
        a drain of the fifth N-MOSFET is coupled to a source of the third N-MOSFET;
        a drain of the sixth N-MOSFET is coupled to a source of the fourth N-MOSFET;
        a source of the fifth N-MOSFET is grounded;
        a source of the sixth N-MOSFET is grounded; and
        a gate of the fifth N-MOSFET is coupled to a gate of the sixth N-MOSFET.

8. The circuitry of claim 1, wherein:
    the third and fourth N-MOSFETs compose a buffer of the combined mixer and buffer circuitry.

9. The circuitry of claim 1, wherein:
    the circuitry is an integrated circuit.

10. The circuitry of claim 1, wherein:
    the circuitry is implemented within a wireless communication device.

11. A combined mixer and buffer circuitry, the circuitry comprising:
    a transconductance module that is operable to process a differential input voltage signal thereby generating a differential current signal;
    a first capacitor;
    a second capacitor;
    a passive mixer that is operable to process the differential current signal thereby generating a first output voltage signal and a second output voltage signal, wherein the passive mixer includes a first native N-MOSFET, a second native N-MOSFET, a third native N-MOSFET, and a fourth native N-MOSFET, wherein:
- a source of a first native N-MOSFET is coupled to a source of a second native N-MOSFET;
- a source of a third native N-MOSFET is coupled to a source of a fourth native N-MOSFET;
- a drain of the first native N-MOSFET is coupled to a drain of the third native N-MOSFET that provides the second output voltage signal;
- a drain of the second native N-MOSFET is coupled to a drain of the fourth native N-MOSFET that provides the first output voltage signal;
- a source of the first native N-MOSFET is coupled to a source of the second native N-MOSFET;
- a source of the third native N-MOSFET is coupled to a source of the fourth native N-MOSFET;
- the first capacitor is coupled between a first output of the transconductance module and the source of the first native N-MOSFET; and
- the second capacitor is coupled between a second output of the transconductance module and the source of the third native N-MOSFET;

first and second N-MOSFETs, wherein:
- the first output voltage signal is provided to a source of the first N-MOSFET; and
- the second output voltage signal is provided to a source of the second N-MOSFET;

third and fourth N-MOSFETs, wherein:
- a gate of the fourth N-MOSFET is coupled to a drain of the first N-MOSFET;
- a gate of the third N-MOSFET is coupled to a drain of the second N-MOSFET;
- a drain of the third N-MOSFET is connected to a drain of the fourth N-MOSFET; and
- a source of the third N-MOSFET and a source of the fourth N-MOSFET correspond to a differential output voltage signal of the circuitry.

12. The circuitry of claim 11, further comprising:
a first resistor coupled between the source of the first N-MOSFET and ground;
a second resistor coupled between the source of the second N-MOSFET and ground;
a third resistor coupled between the drain of the first N-MOSFET and a power supply voltage; and
a fourth resistor coupled between the drain of the second N-MOSFET and the power supply voltage.

13. The circuitry of claim 11, wherein:
the connected drains of the third N-MOSFET and the fourth N-MOSFET are connected to a power supply voltage.

14. The circuitry of claim 11, further comprising:
fifth and sixth N-MOSFETs, wherein:
- a drain of the fifth N-MOSFET is coupled to a source of the third N-MOSFET;
- a drain of the sixth N-MOSFET is coupled to a source of the fourth N-MOSFET;
- a source of the fifth N-MOSFET is grounded;
- a source of the sixth N-MOSFET is grounded; and
- a gate of the fifth N-MOSFET is coupled to a gate of the sixth N-MOSFET.

15. The circuitry of claim 11, wherein:
the circuitry is an integrated circuit.

16. The circuitry of claim 11, wherein:
the circuitry is implemented within a wireless communication device.

17. A combined mixer and buffer circuitry, the circuitry comprising:
a transconductance module that is operable to process a differential input voltage signal thereby generating a differential current signal;
a passive mixer that is operable to process the differential current signal thereby generating a first output voltage signal and a second output voltage signal, wherein the passive mixer includes a plurality of native n-channel metal oxide semiconductor field-effect transistors (N-MOSFETs);

first and second N-MOSFETs, wherein:
- the first output voltage signal is provided to a source of the first N-MOSFET; and
- the second output voltage signal is provided to a source of the second N-MOSFET;
a first resistor coupled between the source of the first N-MOSFET and ground;
a second resistor coupled between the source of the second N-MOSFET and ground;
a third resistor coupled between the drain of the first N-MOSFET and a power supply voltage;
a fourth resistor coupled between the drain of the second N-MOSFET and the power supply voltage; and third and fourth N-MOSFETs, wherein:
- a gate of the fourth N-MOSFET is coupled to a drain of the first N-MOSFET;
- a gate of the third N-MOSFET is coupled to a drain of the second N-MOSFET;
- a drain of the third N-MOSFET is connected to a drain of the fourth N-MOSFET;
- a source of the third N-MOSFET and a source of the fourth N-MOSFET correspond to a differential output voltage signal of the circuitry; and
- the connected drains of the third N-MOSFET and the fourth N-MOSFET are connected to a power supply voltage.

18. The circuitry of claim 17, further comprising:
a first capacitor; and
a second capacitor; and wherein:
the plurality of native N-MOSFET includes a first native N-MOSFET, a second native N-MOSFET, a third native N-MOSFET, and a fourth native N-MOSFET;
a source of the first native N-MOSFET is coupled to a source of the second native N-MOSFET;
a source of the third native N-MOSFET is coupled to a source of the fourth native N-MOSFET;
the first capacitor is coupled between a first output of the transconductance module and the source of the first native N-MOSFET;
the second capacitor is coupled between a second output of the transconductance module and the source of the third native N-MOSFET;
a first clock signal is provided to a gate of the first native N-MOSFET and a gate of the fourth native N-MOSFET; and
a second clock signal is provided to a gate of the second native N-MOSFET and a gate of the third native N-MOSFET.

19. The circuitry of claim 17, wherein:
the circuitry is an integrated circuit.

20. The circuitry of claim 17, wherein:
the circuitry is implemented within a wireless communication device.

* * * * *

UNITED STATES PATENT AND TRADEMARK OFFICE
CERTIFICATE OF CORRECTION

| | | |
|---|---|---|
| PATENT NO. | : 7,679,431 B2 | Page 1 of 1 |
| APPLICATION NO. | : 11/944715 | |
| DATED | : March 16, 2010 | |
| INVENTOR(S) | : Yuyu Chang and Hooman Darabi | |

It is certified that error appears in the above-identified patent and that said Letters Patent is hereby corrected as shown below:

On the Title Page, Item (74): please replace "Marksion" with --Markison--

Signed and Sealed this

Seventh Day of February, 2012

David J. Kappos
*Director of the United States Patent and Trademark Office*